United States Patent
Morinaga et al.

(10) Patent No.: US 8,392,855 B2
(45) Date of Patent: Mar. 5, 2013

(54) TRANSFERRING PATTERN ONTO SEMICONDUCTOR SUBSTRATE USING OPTIMUM TRANSFER CONDITION DETERMINED FOR EACH DIVIDED AREA

(75) Inventors: Hiroyuki Morinaga, Yokohama (JP); Ryoichi Inanami, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 12 days.

(21) Appl. No.: 13/040,294

(22) Filed: Mar. 4, 2011

(65) Prior Publication Data
US 2012/0028378 A1 Feb. 2, 2012

(30) Foreign Application Priority Data
Jul. 30, 2010 (JP) .................................. 2010-172846

(51) Int. Cl.
*G06F 17/50* (2006.01)
(52) U.S. Cl. .................. 716/54; 716/55; 430/5
(58) Field of Classification Search .............. 716/54–55; 430/5
See application file for complete search history.

(56) References Cited

U.S. PATENT DOCUMENTS

| | | | |
|---|---|---|---|
| 6,660,192 B1 * | 12/2003 | Kim et al. ....................... 506/32 |
| 6,884,551 B2 * | 4/2005 | Fritze et al. ....................... 430/5 |
| 7,430,731 B2 * | 9/2008 | Cohen et al. ..................... 716/54 |
| 7,613,538 B2 * | 11/2009 | Wu et al. ....................... 700/120 |
| 7,682,515 B2 * | 3/2010 | Perret et al. ..................... 216/41 |
| 7,682,970 B2 * | 3/2010 | Grigoropoulos et al. ..... 438/662 |
| 7,708,543 B2 * | 5/2010 | Shirotori et al. ............... 425/385 |
| 7,789,647 B2 * | 9/2010 | Kawakami et al. ........... 425/149 |
| 7,807,065 B2 * | 10/2010 | Tokita et al. ..................... 216/44 |
| 7,943,080 B2 * | 5/2011 | Dijksman et al. ............. 264/496 |
| 7,985,517 B2 * | 7/2011 | Tanaka et al. ................... 430/30 |
| 8,003,310 B2 * | 8/2011 | Sandhu et al. ................. 430/323 |
| 2007/0070548 A1 * | 3/2007 | Shirotori et al. ............... 360/135 |
| 2007/0105244 A1 * | 5/2007 | Okita ............................... 438/14 |
| 2008/0003615 A1 * | 1/2008 | Sheetz et al. ................... 435/7.1 |
| 2008/0021587 A1 * | 1/2008 | Wu et al. ....................... 700/121 |
| 2008/0313593 A1 * | 12/2008 | Seo et al. ........................ 716/21 |
| 2009/0267268 A1 | 10/2009 | Yoneda et al. |
| 2009/0275031 A1 * | 11/2009 | Tanner et al. ..................... 435/6 |
| 2010/0124601 A1 | 5/2010 | Ota et al. |
| 2010/0187714 A1 * | 7/2010 | Kobiki et al. ................. 264/135 |
| 2010/0201042 A1 * | 8/2010 | Sreenivasan et al. ......... 264/494 |
| 2010/0237540 A1 * | 9/2010 | Inanami et al. ............... 264/293 |
| 2010/0248482 A1 * | 9/2010 | Hashimoto ................... 438/700 |

FOREIGN PATENT DOCUMENTS
JP 2007-123734 5/2007

* cited by examiner

*Primary Examiner* — Naum Levin
(74) *Attorney, Agent, or Firm* — Finnegan, Henderson, Farabow, Garrett & Dunner, L.L.P.

(57) ABSTRACT

According to one embodiment, a pattern forming method comprises transferring a pattern formed in a surface of a template to a plurality of chip areas in a semiconductor substrate under different transfer conditions. Furthermore, the transferring the pattern formed in the surface of the template to the plurality of chip areas in the semiconductor substrate under the different transfer conditions comprises transferring the pattern formed in the surface of the template to the semiconductor substrate at least twice under each identical transfer condition. Moreover, the pattern forming method comprises dividing each of the plurality of chip areas into a plurality of areas, determining an optimum condition for each set of corresponding divided areas in the plurality of chip areas, and transferring the pattern onto the semiconductor substrate using the optimum transfer condition determined for each divided area.

12 Claims, 12 Drawing Sheets

F I G. 1

F I G. 2

|     | a1  | a2  | a3  | a4  | a5  | a6  | ... |
|-----|-----|-----|-----|-----|-----|-----|-----|
|     | 0.1 | 0.3 | 0.3 | 0.5 | 0.3 | 0.1 | ... |
| b1  | 0.0 | 0.0 | 0.1 | 0.2 | 0.1 | 0.0 | ... |
| c1  | 0.3 | 0.1 | 0.0 | 0.5 | 0.2 | 0.1 | ... |
| ⋮   | ... | ... |     |     |     |     |     |

F I G. 3

|     | a'1 | a'2 | a'3 | a'4 | a'5 | a'6 | ... |   |   |   |   |     |
|-----|-----|-----|-----|-----|-----|-----|-----|---|---|---|---|-----|
|     | 0   | 1   | 1   | 4   | 0   | 0   | 3   | 0 | 0 | 2 | 0 | 1 | ... |
| b'1 | 0   | 0   | 0   | 3   | 0   | 0   | 1   | 0 | 0 | 1 | 0 | 1 | ... |
| c'1 | 1   | 0   | 0   | 4   | 0   | 0   | 1   | 0 | 0 | 1 | 0 | 2 | ... |
| ⋮   | ... | ... | ... | ... |     |     |     |   |   |   |   |     |

TRANSFERRING PATTERN ONTO SEMICONDUCTOR SUBSTRATE USING OPTIMUM TRANSFER CONDITION DETERMINED FOR EACH DIVIDED AREA

CROSS-REFERENCE TO RELATED APPLICATIONS

This application is based upon and claims the benefit of priority from Japanese Patent Application No. 2010-172846, filed Jul. 30, 2010; the entire contents of which are incorporated herein by reference.

FIELD

Embodiments described herein relate generally to a pattern forming method.

BACKGROUND

In recent years, much effort has been made to develop a miniaturization technique called nanoimprinting.

In a pattern forming method for nanoimprinting, a template (mold) is pressed against a pattern forming material (resist) formed on a processing target surface of a wafer. The resultant structure is then irradiated with ultraviolet (UV) light to cure the resist. Then, the template is separated from the resist to form a resist pattern.

However, in the nanoimprinting, a manufacturing variation among templates or a variation in operation among imprint apparatuses disadvantageously results in defects or an abnormal film thickness. Thus, forming high-quality patterns has been difficult.

DETAILED DESCRIPTION

In general, according to one embodiment, a pattern forming method comprises transferring a pattern formed in a surface of a template to a plurality of chip areas in a semiconductor substrate under different transfer conditions. Furthermore, the transferring the pattern formed in the surface of the template to the plurality of chip areas in the semiconductor substrate under the different transfer conditions comprises transferring the pattern formed in the surface of the template to the semiconductor substrate at least twice under each identical transfer condition. Moreover, the pattern forming method comprises dividing each of the plurality of chip areas into a plurality of areas, determining an optimum condition for each set of corresponding divided areas in the plurality of chip areas, and transferring the pattern onto the semiconductor substrate using the optimum transfer condition determined for each divided area.

Embodiments will be described below in detail with reference to the drawings.

EMBODIMENTS

Figure 1:
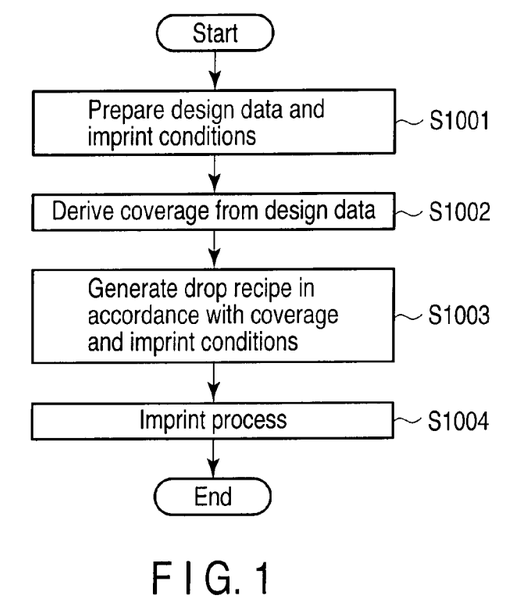
FIG. 1 is a chart schematically illustrating a pattern forming method for nanoimprinting according to an embodiment.
Figure 2:
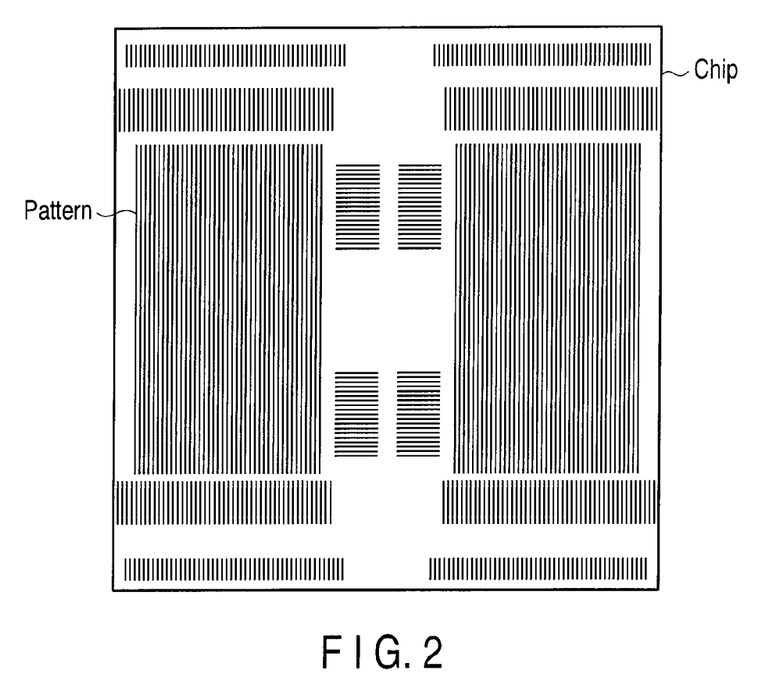
FIG. 2 is a top view schematically showing design data on a pattern to be formed in a surface of a chip.
Figure 3:
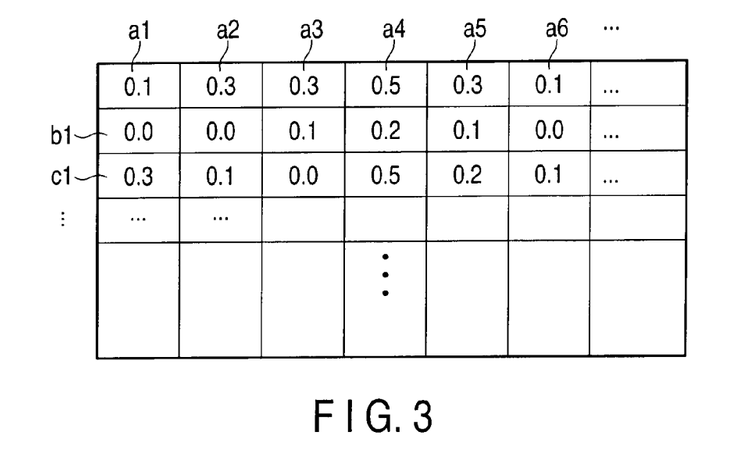
FIG. 3 is a diagram schematically showing a coverage map for the pattern shown in FIG. 2.
Figure 4:
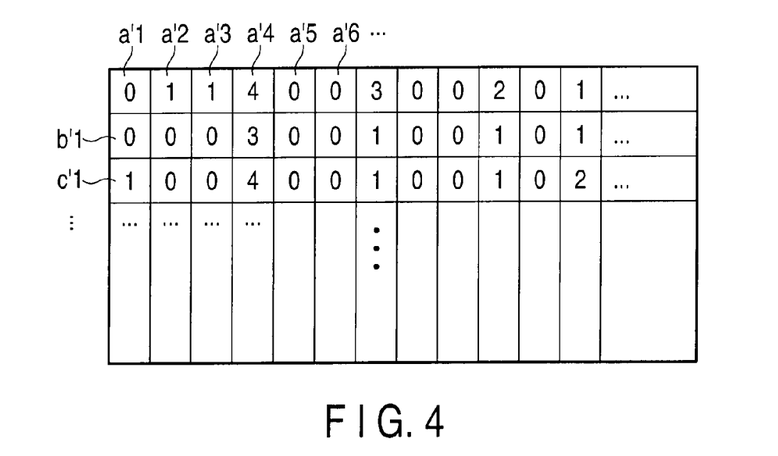
FIG. 4 is a diagram schematically showing a drop recipe.

First, with reference to FIG. 1 to FIG. 8, nanoimprinting will be described in brief in order to make the present embodiment understood easily. FIG. 1 is a flowchart schematically illustrating a pattern forming method for nanoimprinting. FIG. 2 is a top view showing design data on a pattern to be formed on a chip. FIG. 3 is a diagram showing a coverage map for the pattern shown in FIG. 2. FIG. 4 is a diagram schematically showing a drop recipe. FIG. 5 to FIG. 8 are diagrams schematically showing a basic method for manufacturing an imprint pattern.

In the pattern forming method for nanoimprinting, a template in which a pattern to be transferred (a pattern for one chip) is brought into contact with a photocurable resin material (resist) applied to a substrate. The resultant structure is illuminated with light to cure the resist. Moreover, the template is separated from the resist to form a resist pattern. Furthermore, a shot refers to a transfer of a pattern for one chip in the template. Thus, one transfer of a pattern to the resist is hereinafter referred to as one shot.

[S1001]

First, design layout data (for example, CAD data) of a pattern formed in the surface of the template as shown in FIG.

2 and imprint conditions are prepared; the imprint conditions include information on the depth of grooves in the pattern on the template and information on the film thickness of the resist pattern (transfer pattern). The film thickness of the resist pattern refers to the thickness of areas (remaining film) of the resist in which the pattern is not formed. Black line portions shown in FIG. 2 are formed in the surface of the template as a groove pattern.

[S1002]

Then, a coverage is derived from the above-described design layout data (hereinafter simply referred to as design data). A coverage map is then generated which shows the coverage of each of the divided areas (a1, a2, a3, ..., b1, ..., c1, ...) on one chip. For example, the depth of the pattern is not taken into account for the coverage. Furthermore, the coverage is derived from the area of the pattern as seen from its top surface.

[S1003]

As shown in FIG. 4, a drop recipe is generated based on the above-described coverage map and imprint conditions. The drop recipe indicates the amount of drops at each drop position where the resist is dropped onto the substrate. That is, the drop recipe is a map of the amount of resist material applied to the substrate. In FIG. 4, rows and columns indicate the drop positions (a'1, a'2, a'3, ..., b'1, ..., c'1, ...) in a two-dimensional space in the chip (shot). Numerical values each indicate the drop amount of resist dropped at the corresponding position.

[S1004]

Then, an imprint process is carried out using the above-described drop recipe.

A basic method for forming an imprint pattern will be described in brief with reference to FIG. 5 to FIG. 8.

Figure 5:
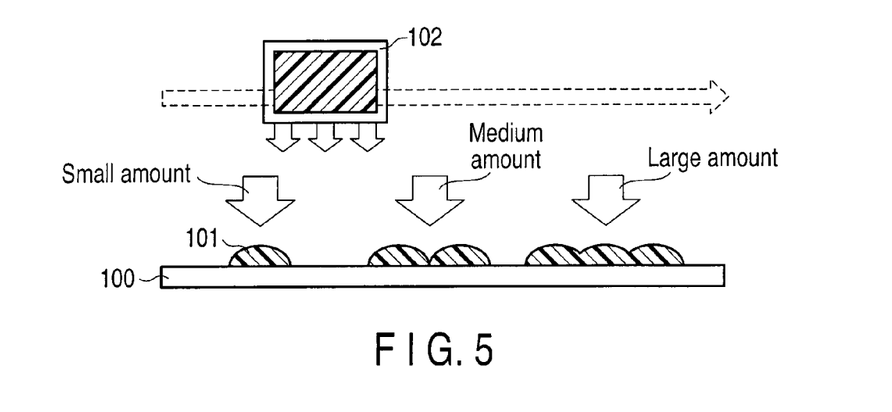
FIG. 5 is a diagram schematically illustrating a part of a basic method for manufacturing an imprint pattern according to the embodiment.

As shown in FIG. 5, a liquid photocurable resin material (nanoimprint material) is applied to a substrate 100 as a resist 101 by an ink-jet method using a head 102. At this time, the head 102 sequentially drops the resist 101 onto the substrate 100 in the direction of an arrow in FIG. 5.

At this time, the optimum resist amount and position vary locally depending on the density and size of interconnects (pattern) formed. For example, the amount of resist 101 needs to be increased in an area with a high interconnect coverage and to be reduced in an area with a low interconnect coverage. For example, a small amount of resist 101 is dropped in an area in which a small-sized pattern is to be formed. A medium amount of resist 101 is dropped in an area in which a medium-size pattern is to be formed. A large amount of resist 101 is dropped in an area in which a large-size pattern is to be formed. Thus, since the resist 101 is applied by the ink-jet method, the amount of resist applied (drop amount) and the drop position can be precisely controlled.

The head 102 is a mechanism configured to apply the resist 101, and for example, comprises plurality of nozzles through which the resist 101 is applied to the substrate 100. Furthermore, the unit of the amount of resist applied by the head 102 is the number of drops (a discrete value). The amount of one drop of resist is about several picoliters. Furthermore, positions where the resist can be dropped are preset at predetermined intervals of several μm. In addition, the substrate may include an underlying material.

Figure 6:
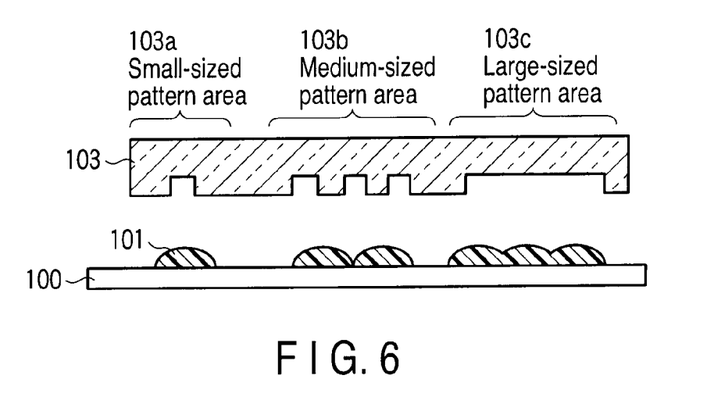
FIG. 6 is a diagram schematically illustrating a part of the basic method for manufacturing an imprint pattern according to the embodiment.

Then, as shown in FIG. 6, a template 103 is prepared. The template 103 is a transparent quartz substrate used as a common photo mask and on which a recessed and protruding pattern (grooves) is formed by plasma etching in accordance with design data. A small-sized pattern area 103a, a medium-sized pattern area 103b, and a large-sized pattern area 103c are formed in the surface of the template 103; a recessed and small-sized pattern for a small amount of resist is formed in the small-sized pattern area 103a, a recessed and medium-sized pattern is formed in the medium-sized pattern area 103b, and a recessed and large-sized pattern is formed in the large-sized pattern area 103c.

Figure 7:
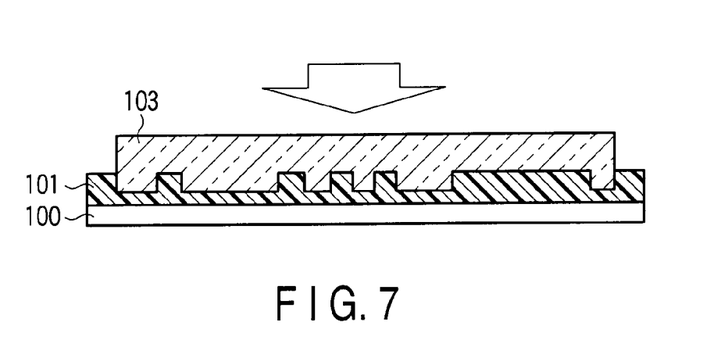
FIG. 7 is a diagram schematically illustrating a part of the basic method for manufacturing an imprint pattern according to the embodiment.

Then, as shown in FIG. 7, the surface of the template 103 is brought into contact with the resist 101. Once the small-sized pattern area 103a, the medium-sized pattern area 103b, and the large-sized pattern area 103c are completely filled with the resist 101, the resist 101 is irradiated with UV light from the back surface of the template 103 with the template 101 kept in contact with the resist 101. Thus, the resist 101 is photocured.

Figure 8:
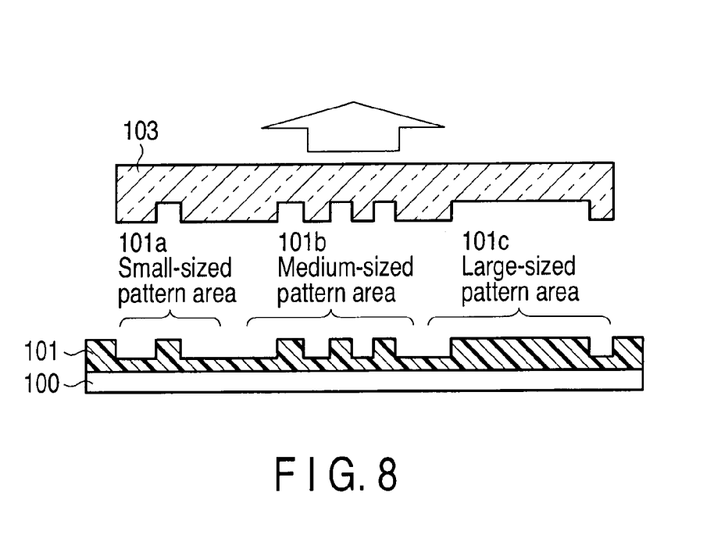
FIG. 8 is a diagram schematically illustrating a part of the basic method for manufacturing an imprint pattern according to the embodiment.

Then, as shown in FIG. 8, the template 103 is raised in the vertical direction for separation. Thus, a protruding small-sized pattern area 101a, a protruding medium-sized pattern area 101b, and a protruding large-sized pattern area 101c are formed in the resist 101. The small-sized pattern area 101a results from transfer of the small-sized pattern area 103a. The medium-sized pattern area 101b results from transfer of the medium-sized pattern area 103b. The large-sized pattern area 101c results from transfer of the large-sized pattern area 103c.

As described above, the drop recipe is derived by a computer or the like based on the design data and imprint conditions. For example, the computer changes the drop amount and drop position of the resist in response to a change in line width or in the depth of the grooves. Thus, if the template is accurately formed as specified in the design data and the imprint steps are accurately carried out, the pattern can be accurately transferred to the resist by using the drop recipe derived as described above.

However, the actual template may fail to be formed as specified in the design data as a result of a manufacturing variation or the like, or imprint-specific errors may occur during the imprint steps. Thus, even with the drop recipe derived as described above, the drop amount and drop position of the resist may deviate from the ideal condition as a result of the above-described variation. As a result, the patterns formed may be defective.

Hence, the drop amount and drop position of the resist need to be appropriately controlled for each of the areas in one shot (chip) with a manufacturing variation among templates or an imprint apparatus-specific variation.

Thus, in the present embodiment, imprinting is experimentally carried out with the drop amount and drop position of the resist varied, based on settings described below. Then, one chip area is divided into a plurality of areas, and the optimum drop amount and drop position of the resist are derived for each divided area.

Figure 9:
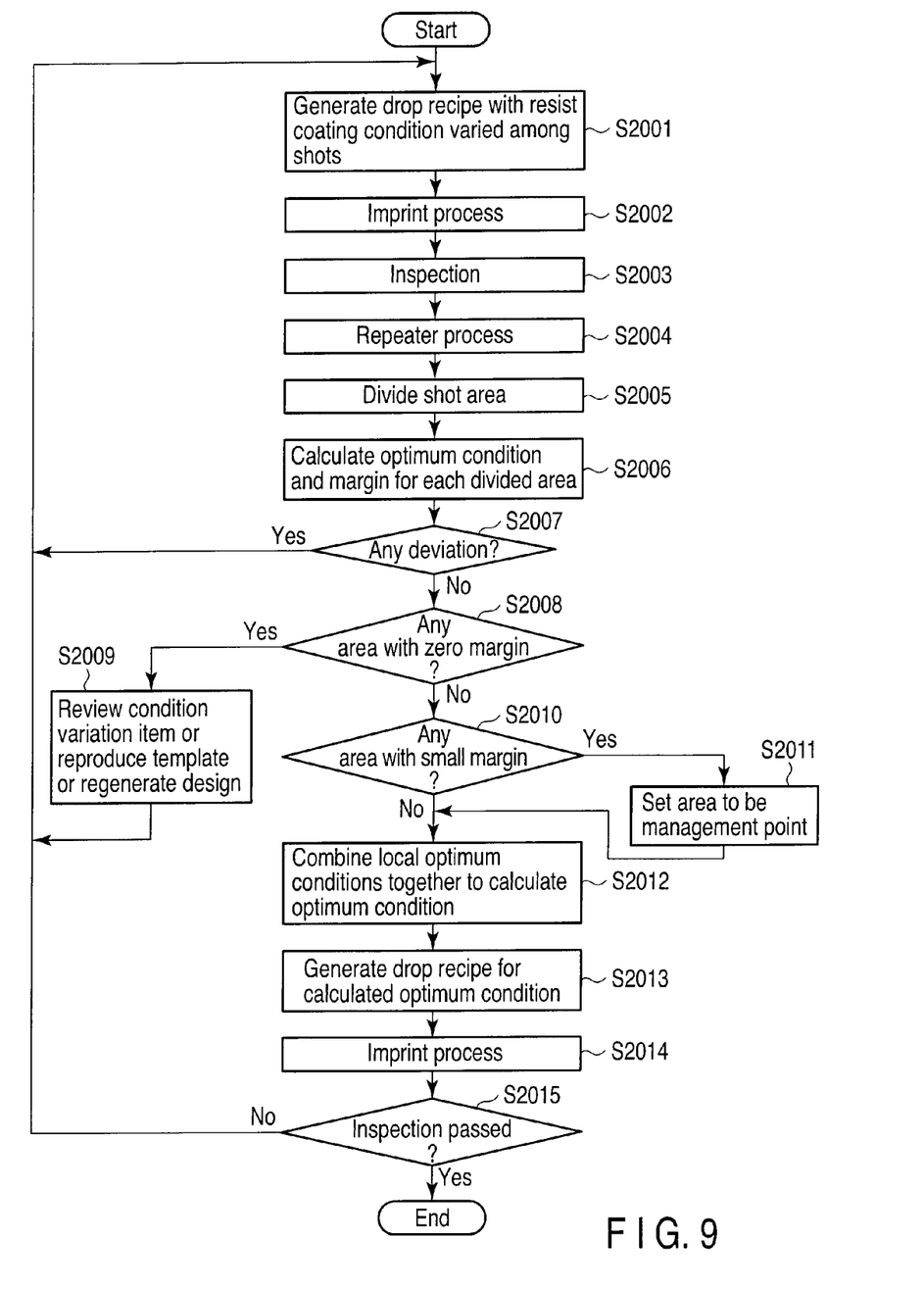
FIG. 9 is a chart schematically illustrating a basic pattern forming method according to the embodiment.
Figure 10:
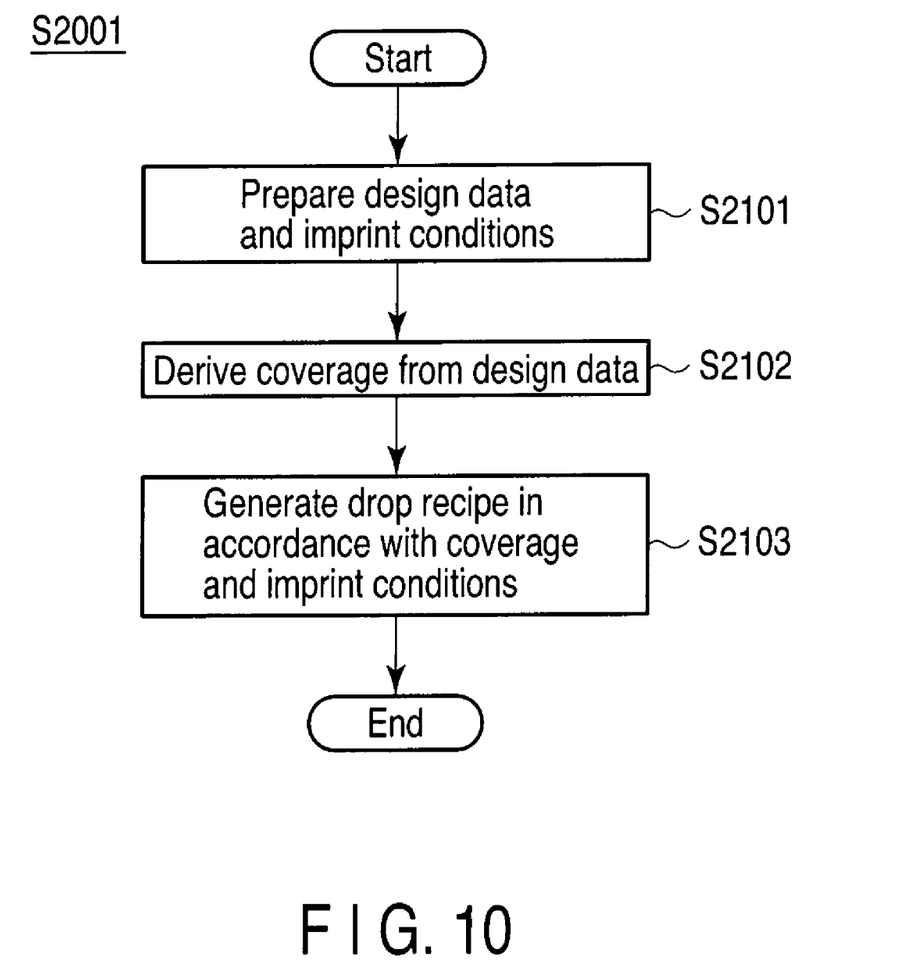
FIG. 10 is a chart schematically illustrating a part of the pattern forming method according to the embodiment.

A method for generating a drop recipe according to the present embodiment will be described below with reference to FIG. 9 and FIG. 10. FIG. 9 is a flowchart schematically illustrating a pattern forming method according to the present embodiment. FIG. 10 is a flowchart schematically illustrating a part of the pattern forming method according to the present embodiment. In the method for generating a drop recipe, the design data is virtually changed or the imprint conditions and the like are changed. However, the template itself, which is actually subjected to imprinting, is not changed.

[S2001]

First, a plurality of drop recipes with resist application conditions varied with the shot are generated.

As described above, a drop recipe is generated using design data and imprint conditions including information on the depth of grooves in a pattern for the template and information on the film thickness of a resist pattern. That is, the drop recipe is uniquely determined by the specified statistical data and imprint conditions. Thus, when preliminary experiments are carried out, various settings (conditions) are varied to set a plurality of preliminary drop recipes. Possible varying conditions are as follows.

(Setting 1) The interconnect width in the design data is varied to vary the coverage.

(Setting 2) The coverage is uniformly varied.

(Setting 3) The set value of the depth of the grooves in the template is varied.

(Setting 4) The set value of the film thickness is varied.

(Setting 5) The drop amount is uniformly varied over the entire shot.

Here, Setting 1 is implemented by graphically processing (resizing) the design data. For example, the line width on CAD data is varied. The graphical processing can be achieved by, for example, using an EDA tool. With the line width on the design data changed, the optimum drop recipe is determined depending on the varied line width.

For Setting 2, the calculated coverage is uniformly varied without varying the design data. For example, the above-described converge map is varied by multiplying the coverage by n (n is an integer) or adding m (m is any number) to the coverage.

For Setting 3 to Setting 5, imprint conditions (input parameters) for a drop recipe generation tool may be varied.

For Setting 3, the depth may be varied because the CAD data (design data) includes no depth data.

For Setting 4, a variation is made to the thickness (setting) of the remaining film in the area of the resist to which the groove pattern in the surface of the temperature is not transferred.

For Setting 5, the drop amount in the drop recipe is directly varied so that for example, one drop is added to each of the drop amounts for the shot.

For each shot, at least one of the conditions in Setting 1 to Setting 5 described above is changed. At this time, at least 2 and preferably 5 to 10 shots may undergo the same conditions in order to allow defective inspection or validation of positional dependence to be carried out. Shots under the same conditions are preferably located close to each other.

Figure 11A:
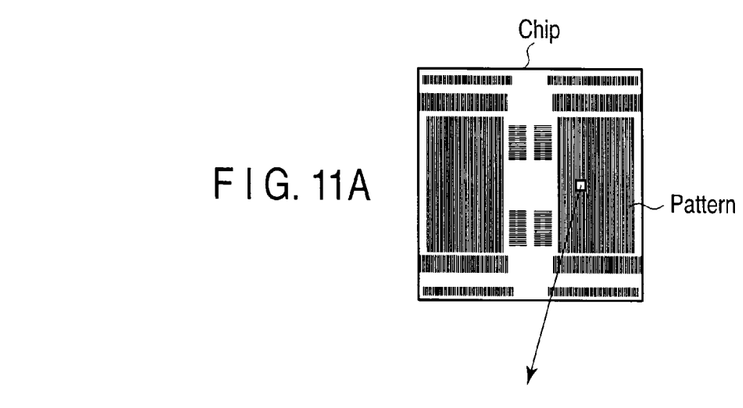
FIG. 11A is a top view showing chip design data.
Figure 11B:
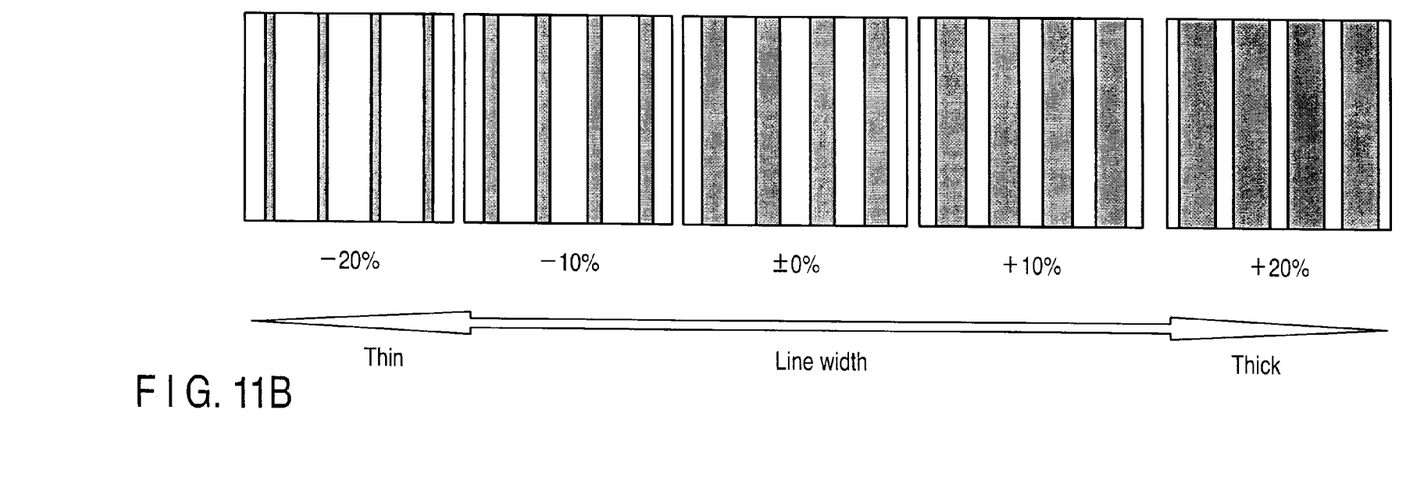
FIG. 11B is a diagram obtained by partly enlarging FIG. 11A and showing how the interconnect width is changed.

A method for generating an exemplary drop recipe will be described with reference to FIG. 10, FIG. 11A, and FIG. 11B. FIG. 11A and FIG. 11B show an example of graphic processing in which the interconnect line in the design data is varied.

[S2101]

First, design data (CAD data) on a pattern formed in the surface of the template and imprint conditions are prepared; the imprint conditions include information on the depth of grooves in the pattern on the template and information on the film thickness of the resist pattern.

At this time, as shown in FIG. 11A and FIG. 11B, the design data is resized within the range between −20% and +20%. Specifically, for example, the design data is used to vary the line width of the pattern in increments of 10% as in −20%, −10%, ±0%, +10%, and +20%. Then, the five types of design data obtained is used as design data for pattern transfer. Here, a line width of ±0% is similar to the line width of the template. As the line width decreases as in −10%, −20%, ..., the line width becomes progressively smaller than that measured before the resizing. As the line width decreases as in +10%, +20%, ..., the line width becomes progressively larger than that measured before the resizing.

The conditions in Setting 3 and Setting 4 can be varied during this step.

To vary the condition in Setting 3, the depth is varied within the range of −20 to +20 nm (0 nm=initially set depth) to provide a plurality of depth data.

To vary the condition in Setting 4, the film thickness of the remaining film is varied within the range of −20 to +20 nm (0 nm=initially set film thickness of remaining film) to provide a plurality of depth data.

[S2102]

Then, the coverage indicative of the rate at which the resist is covered with the pattern is derived from the above-described plurality of design data. Then, a coverage map is generated which shows the coverage of each of the areas into which one chip is divided based on the minimum unit.

The condition in Setting 2 can be varied during this step.

To vary the condition in Setting 2, the derived coverage map is varied. Specifically, the coverage for the shot is varied within the range of −0.5 to +0.5 (0=initially derived coverage) to generate a plurality of coverage maps.

[S2103]

A plurality of drop recipes are generated based on the above-described coverage maps and imprint conditions.

According to the present example, the condition in Setting 1 is varied to generate five types of drop recipes.

The condition in Setting 5 can be varied during this step.

To vary the condition in Setting 5, the derived drop recipe is varied. Specifically, the drop recipe is varied within the range of −5 to +5 drops (0=reference amount obtained with no variation in condition) to generate a plurality of drop recipes.

[S2002]

Figure 12:
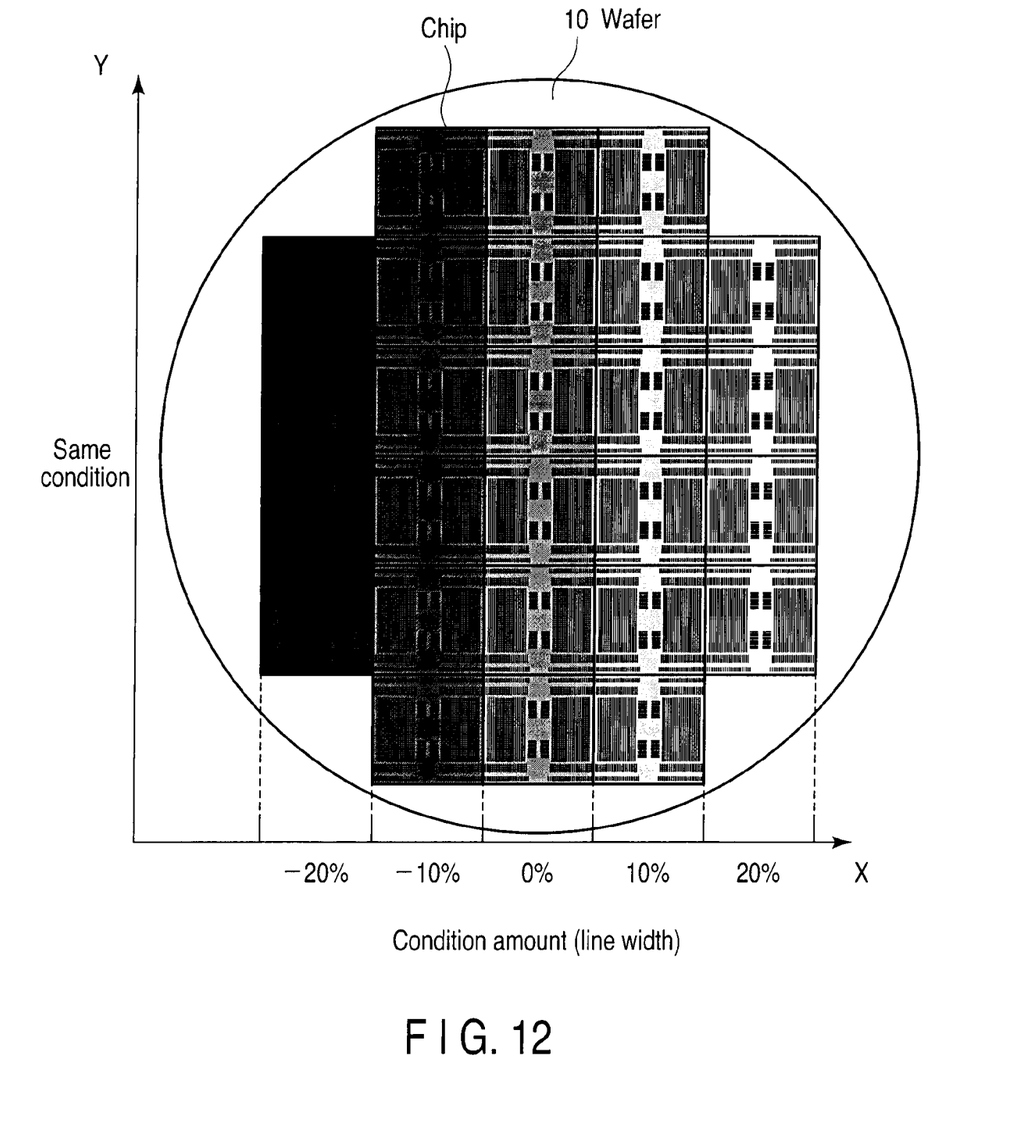
FIG. 12 is a top view of a wafer on which patterns have been formed using different drop recipes.

As shown in FIG. 12, imprinting is carried out using the different drop recipes for the respective chip areas in the wafer (for example, the semiconductor substrate) 10. In the present example, a shot is carried out using the same condition (same drop recipe) on the Y-axis, while using drop recipes with different condition values on the X-axis. Specifically, on the X-axis, the drop recipes are used in the following order from left to right: a drop recipe with a line width of −20%, a drop recipe with a line width of −10%, a drop recipe with a line width of −0%, a drop recipe with a line width of +10%, and a drop recipe with a line width of +20%. The template used in this case has the same pattern as that in the design data.

[S2003]

Then, the resist pattern formed in step S2002 is inspected. That is, one of the defect inspection and film thickness measurement of the resist pattern is carried out.

[S2004]

In the defect inspection of the resist pattern, to remove random components from detected defects, a repeater process is carried out to compare patterns in shots with the same settings with each other to detect defects for each condition. Furthermore, an identical pattern extraction process (design-based binning [DBB]) is carried out to compare a repeated pattern within one shot with a similar repeated pattern within the same shot, or a similar repeated pattern within another shot with the same conditions. Thus, defects dependent on the condition value (line width) and other then random ones can be extracted. Furthermore, in a method for measuring the film thickness of the resist pattern, the film thickness is measured at plurality of locations. Then, the values obtained are averaged, and abnormal values are removed.

Thus, as shown in FIG. 13A, FIG. 13B, FIG. 13C, FIG. 13D, and FIG. 13E, the relationship between the resist pattern and the inspection result (for example, the result of the defect inspection and the film thickness measurement) is derived. The inspection result is obtained by plotting defects or abnormal film thicknesses (film thickness errors) larger than a predetermined one, in accordance with the resist pattern.

Figure 13A:
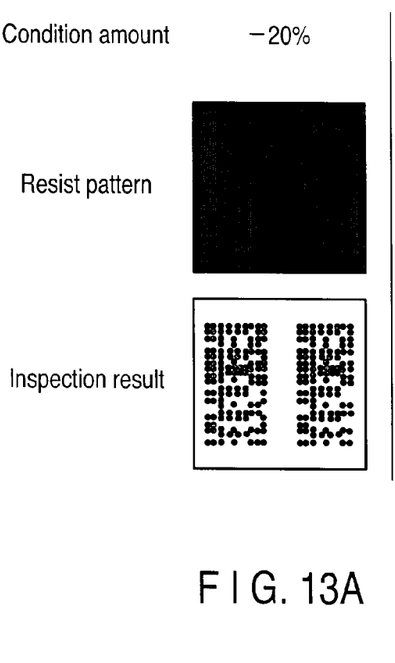
FIG. 13A is a diagram showing the relationship between a resist pattern and an inspection result in which a condition amount is −20%.
Figure 13B:
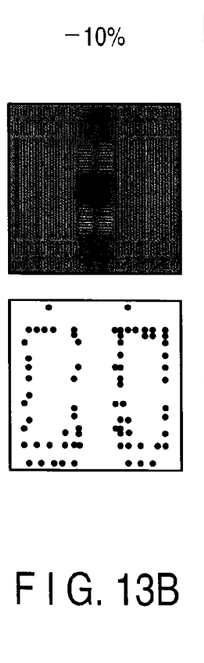
FIG. 13B is a diagram showing the relationship between a resist pattern and an inspection result in which the condition amount is −10%.
Figure 13C:
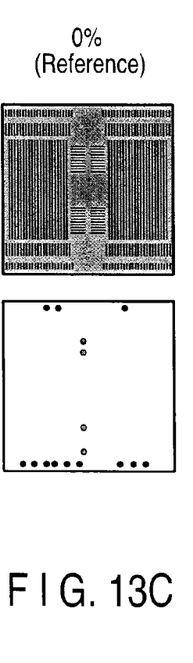
FIG. 13C is a diagram showing the relationship between a resist pattern and an inspection result in which the condition amount is 0%.
Figure 13D:
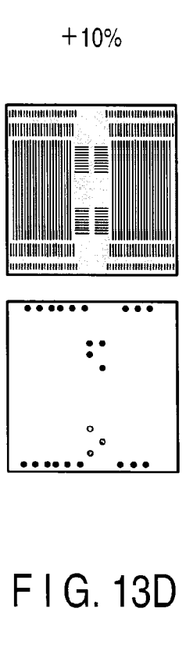
FIG. 13D is a diagram showing the relationship between a resist pattern and an inspection result in which the condition amount is +10%.
Figure 13E:
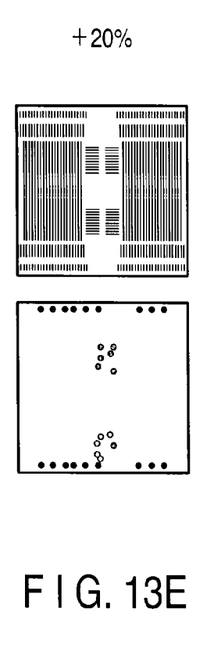
FIG. 13E is a diagram showing the relationship between a resist pattern and an inspection result in which the condition amount is +20%.

As shown in FIG. 13A, when for example, the line width is −20%, no defect or the like is detected in areas with low pattern densities, whereas many defects or the like are detected in areas with high pattern densities. As shown in FIG. 13B, when the line width is −10%, more defects or the like occur in areas with low pattern densities than in the case with a line width of −20%, whereas less defects or the like occur in areas with high pattern densities than in the case with a line width of −20%. As shown in FIG. 13C, when the line width is 0%, more defects or the like occur in areas with low pattern densities than in the case with a line width of −10%, whereas less defects or the like occur in areas with high pattern densities than in the case with a line width of −10%, with no defect or the like detected. As shown in FIG. 13D, when the line width is +10%, more defects or the like occur in areas with low pattern densities than in the case with a line width of 0%, whereas no defect or the like is detected in areas with high pattern densities as in the case with a line width of 0%. As shown in FIG. 13E, when the line width is +20%, more defects or the like occur in areas with low pattern densities than in the case with a line width of 10%, whereas no defect or the like is detected in areas with high pattern densities as in the case with a line width of 0%.

In FIG. 13A, FIG. 13B, FIG. 13C, FIG. 13C, FIG. 13D, and FIG. 13E, the defects are not distinguished from abnormal film thicknesses (film thickness errors). However, the defects can be distinguished from the abnormal film thicknesses by for example, using different plot colors.

Figure 14A:
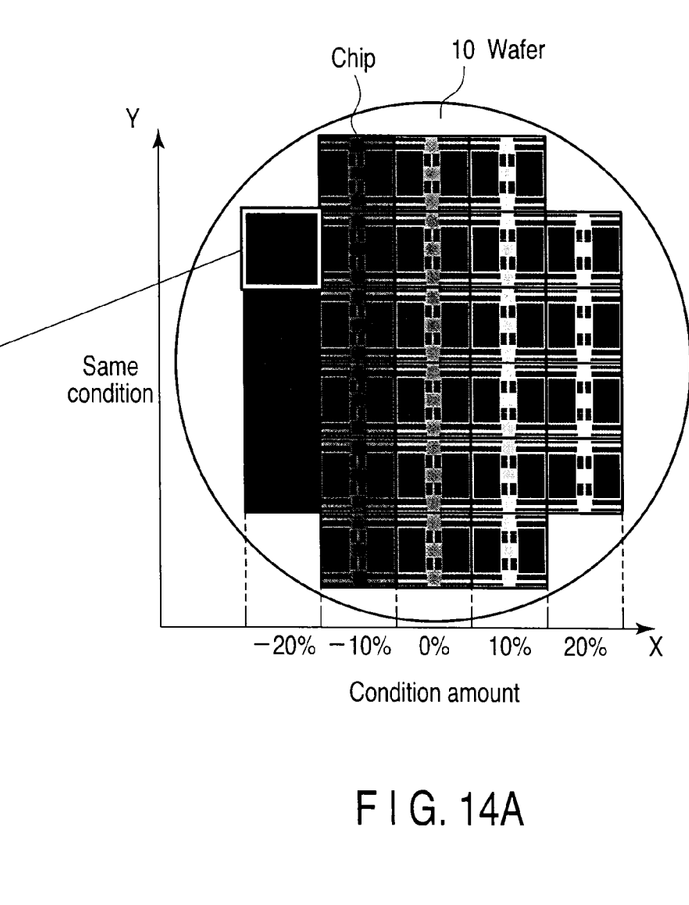
FIG. 14A is a top view of a wafer on which patterns have been formed using different drop recipes.
Figure 14B:
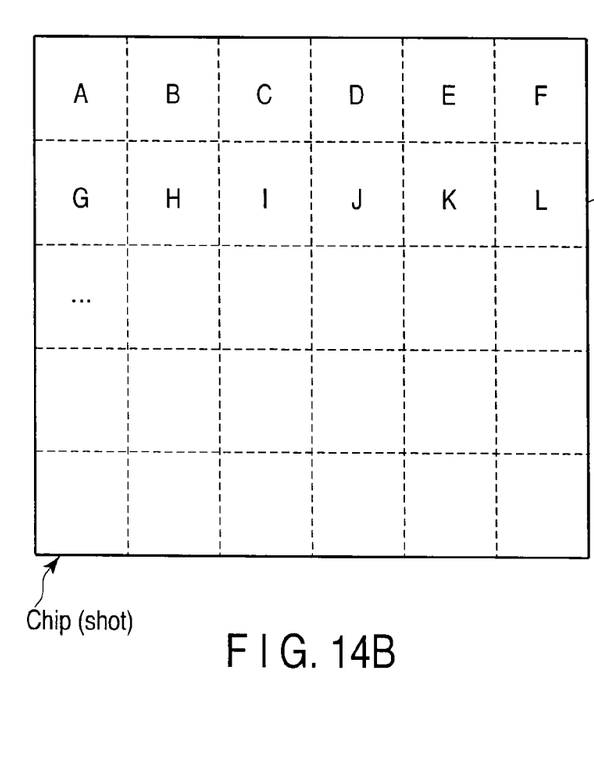
FIG. 14B is an enlarged view of one chip in FIG. 14A.

Then, as shown in FIG. 14A and FIG. 14B, one shot area (one chip area) is divided into a plurality of very small areas. For example, the divided areas are named area A, area B, area C, . . . . In this example, as shown in FIG. 14A and FIG. 14B, the divided areas are in a grid pattern. However, the areas may partly overlap so as to provide the boundary between the divided areas with a margin.

[S2006]

Then, the relationship between a control amount (condition amount) and an observation value (defect density or film thickness measured value) is derived.

Figure 15:
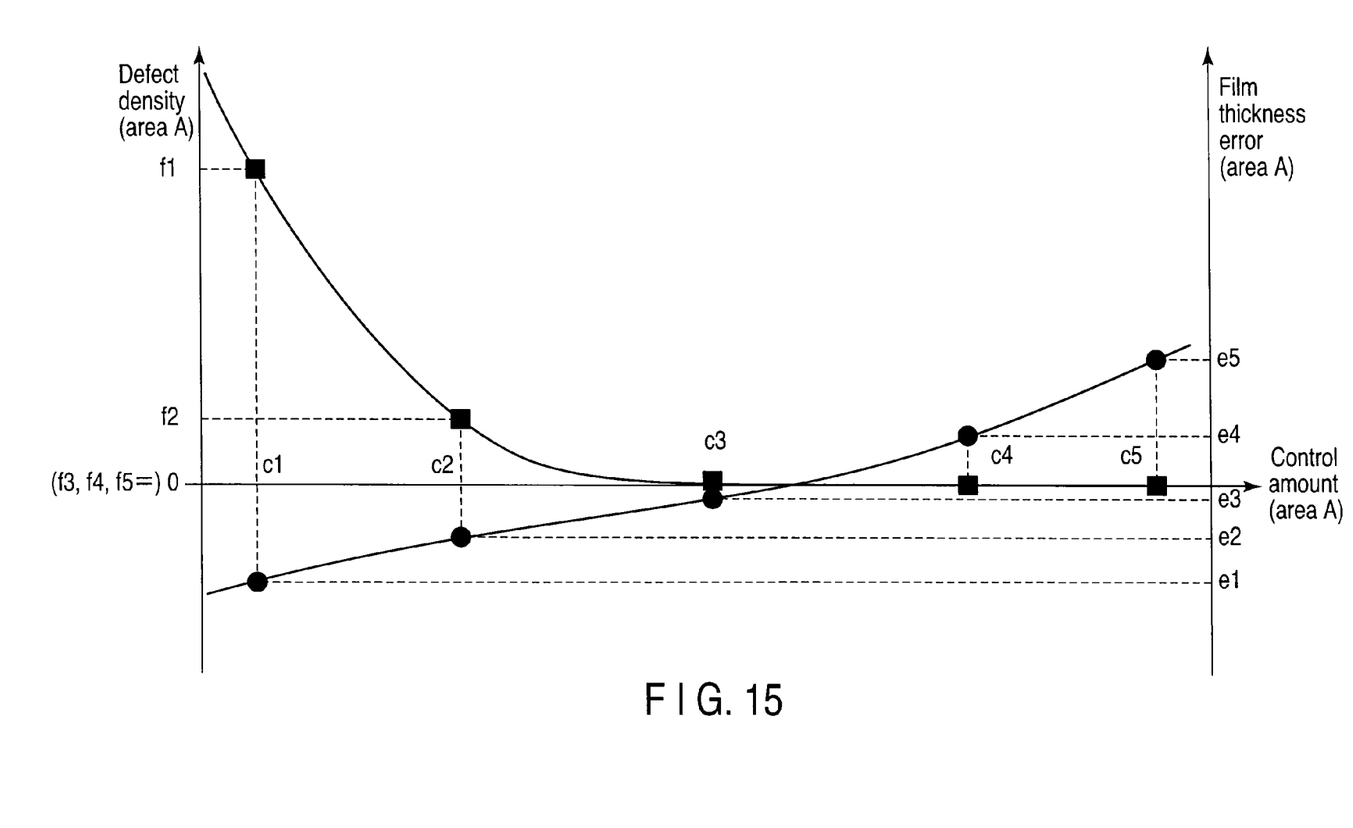
FIG. 15 is a diagram illustrating the relationship between a control amount and an observation value for an area A.

FIG. 15 shows the relationship between the control amount and the observation amount in area A by way of example. The abscissa represents the control amount; the left ordinate, the detect density; and the right ordinate, the film thickness error. As shown in FIG. 15, when the control amount is at a value c1, the defect density is at a value f1 and the film thickness error is at a value e1 (e1<0). Thus, it is expected that at control amount c1, the film thickness of the resist has a negative value with respect to a reference value (film thickness=0), resulting in an unfilled template error caused by an insufficient film thickness. At a control amount c2, the defect density is at a value f2 (f1>f2) and the film thickness error is at a value e2 (e1<e2<0). The defect density is lower and the film thickness error is smaller than at control amount c1. Furthermore, at a control amount c3, the defect density is at a value f3 (f2>f3=0) and the film thickness error is at a value e3 (e2<e3<0). In this case, no defect occurs and the film thickness error is smaller than at control amount c2. Additionally, at a control amount c4, the defect density is at a value f4 (f4=0) and the film thickness error is at a value e4 (e3<0<e4). Thus, unlike in the case of control amount c3 (negative value), the value of the film thickness error is positive, and the film thickness of the resist is larger than the reference value. In addition, at a control amount c5, the defect density is at a value f5 (f5=0) and the film thickness error is at a value e5 (0<e4<e5). Thus, the film thickness error is larger than at control amount c4.

Figure 16:
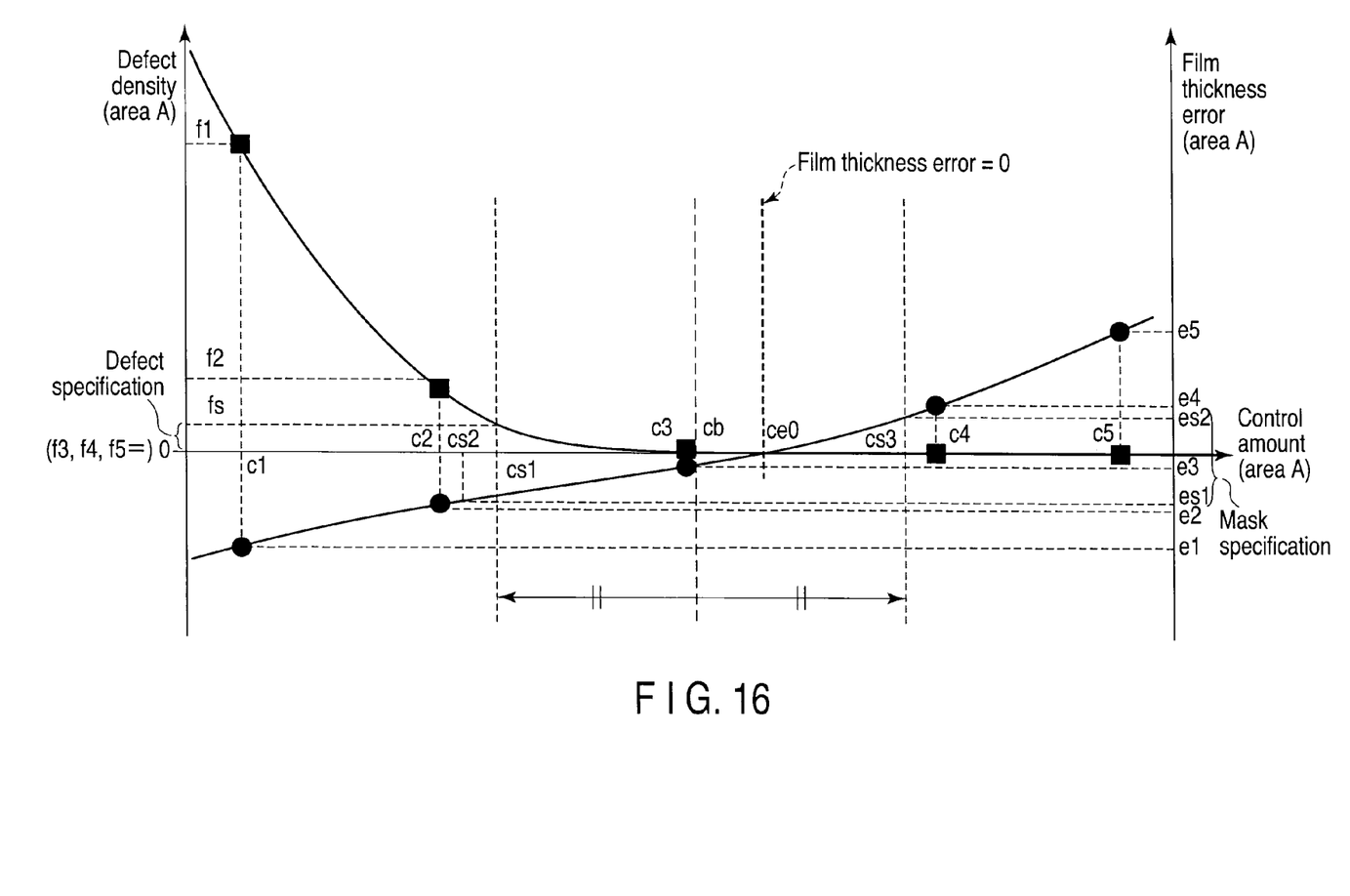
FIG. 16 is a diagram illustrating the relationship between the control amount and the observation value for area A.

Then, as shown in FIG. 16, the graph shown in FIG. 15 is provided with a defect specification fs and film thickness specifications es1 and es2. The defect specification fs is, for example, an acceptable value for the defect density in area A. Film thickness specifications es1 and es2 (es1<0<es2) are, for example, acceptable values for the film thickness error in area A. That is, the optimum control amount desirably has a value (control amount cs1) corresponding to a defect density less than or equal to the defect specification fs. Furthermore, the optimum control amount desirably has a value (cs2) corresponding to a film thickness error greater than or equal to film thickness specification es1 and a value (cs3) corresponding to a film thickness error less than or equal to film thickness specification es2. The range of the optimum control amount is at least cs1 and at least cs2 and at most sc3. In the present example, cs1<cs2<cs3, and the range of the optimum control amount (hereinafter referred to as the margin) is thus at least cs1 and at most cs3. Thus, the range of the condition (margin) can be determined within which both the defect and the film thickness fall within the range of the specifications.

Here, for example, the center of the margin (control amount cb) is determined to be the optimum condition for the control amount. Alternatively, a control amount ce0 at which the film thickness error is 0 may be determined to be the optimum condition for the control amount.

[S2007]

If the condition for film thickness error=0 deviates from the optimum condition, Condition 4 needs to be reviewed. For example, if control amount ce0 is closer to control amount cs1 or cs3 than to control amount cb, the process returns to step S2001 to vary the film thickness of the remaining film. Furthermore, if the wafer has been formed with Condition 4 varied, a combination of conditions which minimizes the deviation is selected.

[S2008]

In each of the areas, whether or not there is any area which has a margin (local margin) of zero is determined.

[S2009]

In step S2008, if any of the areas has a margin of zero, a different one of Condition 1 to Condition 5 is selected or the range of variation in the condition is changed. Alternatively, the template itself is determined to be defective, and a new template is produced. Alternatively, the design data is reviewed. The process then returns to step S2001.

[S2010]

In each of the areas, whether or not there is any area which has a margin with a value smaller than a preset range of values is determined.

[S2011]

In step S2011, if any of the areas has a margin with a value smaller than the preset range of values, the area is set to be a management point (hot spot). Thus, the management point may be exclusively monitored for defective inspection or film thickness measurement after imprinting.

[S2012]

Figure 17:
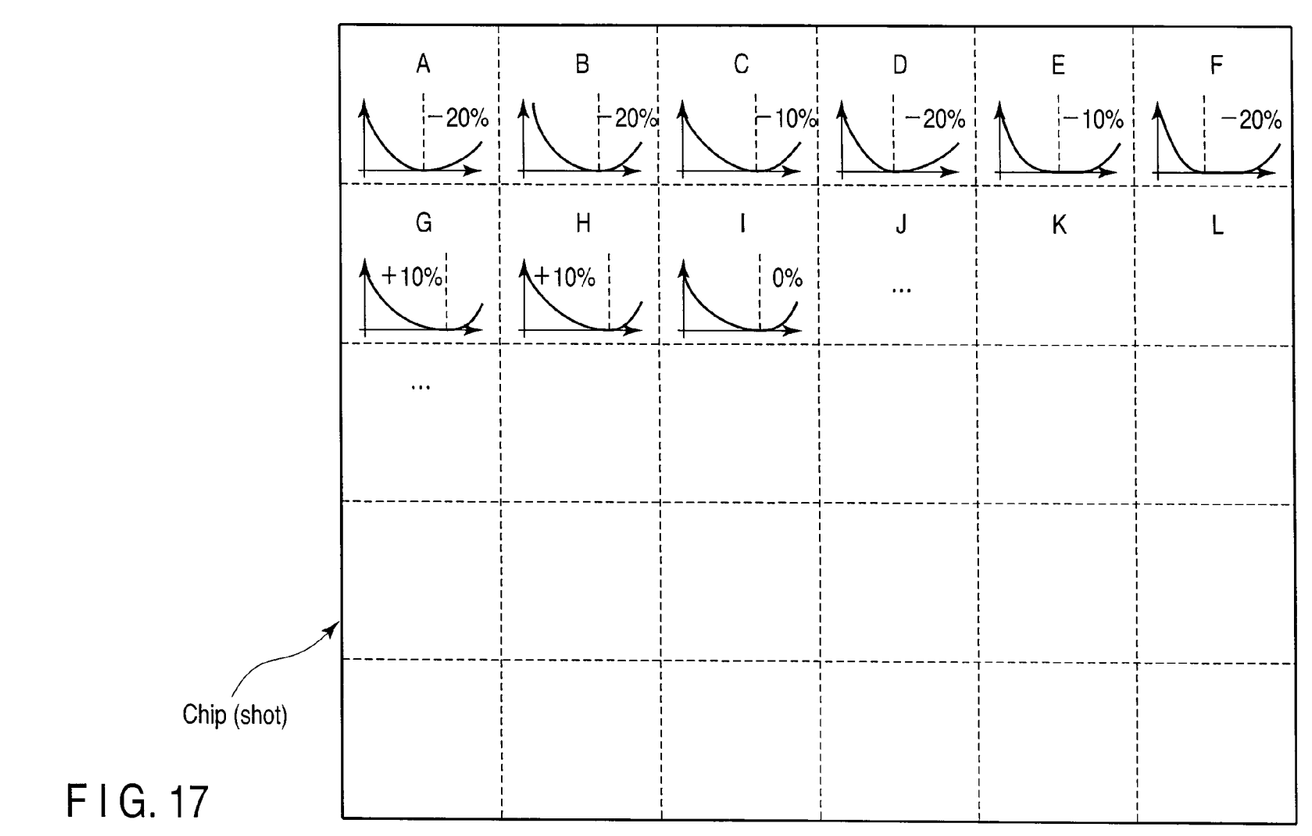
FIG. 17 is a diagram showing optimum condition for each area of one chip.

Then, as shown in FIG. 17, the local optimum conditions for the areas derived in step S2006 (area A, area B, area C . . . ) are combined together to derive the optimum condition for the chip. For example, if Condition 1 is varied (variation in the interconnect width in the design data), the optimum line width (control amount or condition amount) varies among the areas; the optimum line width (control amount or condition amount) is −20% for area A, −20% for area B, and −10% for area C. The optimum condition is set for the chip by setting the optimum condition for each of the areas. Then, the optimum condition for the chip is used to resize the design data for each area. Virtual design data is thus obtained. A drop recipe is determined in association with the design data.

When any of Condition 2 to Condition 5 is varied, the condition amount may similarly be varied among the divided areas.

In step S2005, if the areas are allowed to partly overlap, the condition amount for the overlapping part (for example, an area A1 corresponding to the overlapping part of areas A and B) is derived by averaging the condition amounts for the overlapping areas or varying the condition amount in a stepwise fashion.

[S2013]

The optimum drop recipe is generated by using the optimum condition (including the imprint condition) for the chip derived in step S2012.

[S2014]

Then, the optimum drop recipe is used to drop resist onto a wafer to be used for actual manufacturing, thus forming a pattern (imprinting).

[S2015]

Thereafter, the pattern formed on the wafer is inspected (defect inspection or film thickness measurement) to confirm that the pattern is normal. If the pattern is determined to be abnormal, the process returns to, for example, step S2001.

In the pattern forming method according to the above-described embodiment, one shot (one chip area) is divided into a plurality of areas. Then, the optimum drop recipe is derived for each of the divided areas.

Thus, a drop recipe can be generated with manufacturing variation among templates and imprint-specific variation taken into account. Hence, a high-quality pattern can be formed using the proper drop recipe.

Furthermore, the margin for each of the areas in the chip is determined to allow an area (critical point) corresponding to a hot spot with a small margin (management point) to be easily set. As a result, in the steps of manufacturing a device (semiconductor device), this area may be exclusively inspected. Not all the areas in the chip need to be inspected.

In the above-described embodiments, in the inspection in step S2003, the pattern is inspected for defects and the film thickness of the pattern is measured. However, in step S2003, the sectional shape of the pattern or the pattern size may be measured. Then, as is the case with the method using defects or the film thickness, the optimum condition can be derived for each of the divided areas using the sectional shape or the size. The sectional shape may be measured by for example, placing a needle or the like along the resist pattern. The pattern size may be measured by for example, irradiating the resist pattern with light and observing reflected light.

Furthermore, in the above-described embodiments, the optimum condition is derived for each of the divided areas using defects in the pattern and the film thickness of the pattern. However, effects similar to those of the above-described embodiments are exerted by deriving the optimum condition based on information on defects in the pattern, the film thickness of the pattern, the size of the pattern, or the sectional shape of the pattern.

Additionally, in the above-described embodiments, experiments are carried out by using one wafer and varying the conditions. However, the present invention is not limited to this aspect. Experiments may be carried out by using a plurality of wafers and varying the conditions.

While certain embodiments have been described, these embodiments have been presented by way of example only, and are not intended to limit the scope of the inventions. Indeed, the novel embodiments described herein may be embodied in a variety of other forms; furthermore various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A pattern forming method comprising:
    transferring a pattern formed in a surface of a template to a plurality of chip areas in a semiconductor substrate under different transfer conditions, wherein transferring the pattern formed in the surface of the template to the plurality of chip areas in the semiconductor substrate under the different transfer conditions comprises transferring the pattern formed in the surface of the template to the semiconductor substrate at least twice under each identical transfer condition;
    dividing, by a computer, each of the plurality of chip areas into a plurality of areas;
    determining, by the computer, an optimum transfer condition for each set of the corresponding divided areas in the plurality of chip areas; and
    transferring the pattern onto the semiconductor substrate using the optimum transfer condition determined for each of the divided area.

2. The method according to claim 1, wherein the optimum transfer condition is derived based on information on a defect, a film thickness, a size, or a sectional shape in the divided area.

3. The method according to claim 1, wherein determining the optimum transfer condition comprises deriving a relationship between the different transfer conditions and a transfer result obtained by transferring the pattern formed in the surface of the template to the plurality of chip areas in the semiconductor substrate under the different transfer conditions.

4. The method according to claim 1, wherein the determining the optimum transfer condition comprises determining an acceptable range of the transfer condition.

5. The method according to claim 4, wherein a divided area for which the acceptable range of the transfer condition is smaller than a predetermined range is treated as a critical area.

6. The method according to claim 5, further comprising inspecting the critical area of the semiconductor substrate to which the pattern has been transferred using the optimum condition, for the defect, the film thickness, the size, or the sectional shape.

7. The method according to claim 1, wherein transferring the pattern formed in the surface of the template to the plurality of chip areas in the semiconductor substrate under the different transfer conditions comprises transferring the pattern to an imprint material dropped on the semiconductor substrate by ink jet in accordance with drop recipes corresponding to the different transfer conditions.

8. The method according to claim 7, wherein the imprint material is a photocurable resin material.

9. The method according to claim 1, wherein the transfer condition is determined based on a line width of the pattern, a depth of a groove, or a film thickness of a transfer pattern after the pattern transfer.

10. The method according to claim 1, wherein the divided areas are in a grid pattern.

11. The method according to claim 1, wherein the plurality of chip areas are arranged in an identical semiconductor substrate.

12. The method according to claim 1, wherein the template is a single template.

* * * * *

UNITED STATES PATENT AND TRADEMARK OFFICE
CERTIFICATE OF CORRECTION

PATENT NO. : 8,392,855 B2  Page 1 of 1
APPLICATION NO. : 13/040294
DATED : March 5, 2013
INVENTOR(S) : Morinaga et al.

It is certified that error appears in the above-identified patent and that said Letters Patent is hereby corrected as shown below:

In the Claims:

Column 10, line 22, change "each of the divided area." to --each of the divided areas.--

Signed and Sealed this
Twenty-first Day of May, 2013

Teresa Stanek Rea
*Acting Director of the United States Patent and Trademark Office*